(12) United States Patent
Jaw et al.

(10) Patent No.: US 11,531,440 B2
(45) Date of Patent: Dec. 20, 2022

(54) PRESSURE SENSING DISPLAY MODULE AND PANEL HAVING THE SAME

(71) Applicants: Interface Technology (ChengDu) Co., Ltd., Chengdu (CN); Interface Optoelectronics (Shenzhen) Co., Ltd., Shenzhen (CN); General Interface Solution Limited, Miaoli County (TW)

(72) Inventors: Ten-Hsing Jaw, ChengDu (CN); Han Lung Tsai, ChengDu (CN); I-chang Kuan, ChengDu (CN)

(73) Assignees: INTERFACE TECHNOLOGY (CHENGDU) CO., LTD., Chengdu (CN); INTERFACE OPTOELECTRONICS (SHENZHEN) CO., LTD, Shenzhen (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 17/200,240

(22) Filed: Mar. 12, 2021

(65) Prior Publication Data
US 2021/0325986 A1    Oct. 21, 2021

(30) Foreign Application Priority Data
Apr. 15, 2020 (CN) .......................... 2020102944624

(51) Int. Cl.
*G06F 3/045* (2006.01)

(52) U.S. Cl.
CPC .... *G06F 3/045* (2013.01); *G06F 2203/04102* (2013.01); *G06F 2203/04105* (2013.01)

(58) Field of Classification Search
None
See application file for complete search history.

(56) References Cited

U.S. PATENT DOCUMENTS

| | | | |
|---|---|---|---|
| 6,841,743 B2 * | 1/2005 | Okada | H01C 10/345 200/5 R |
| 2010/0259497 A1 * | 10/2010 | Livingston | H03K 17/962 345/173 |
| 2017/0052617 A1 * | 2/2017 | Okuzumi | G06F 3/0362 |
| 2017/0177160 A1 * | 6/2017 | Oh | G06F 3/0412 |

* cited by examiner

*Primary Examiner* — Amare Mengistu
*Assistant Examiner* — Sarvesh J Nadkarni
(74) *Attorney, Agent, or Firm* — Polsinelli PC (57) ABSTRACT

A pressure sensing display module has a display area and a wiring area surrounding a periphery of the display area. The pressure sensing display module includes a force sensitive unit provided in the wiring area; and a display unit provided corresponding to the display area. Information generated by the display unit is displayed on the display area.

18 Claims, 12 Drawing Sheets

PRESSURE SENSING DISPLAY MODULE AND PANEL HAVING THE SAME

CROSS REFERENCE TO RELATED APPLICATION

This application claims priority to Chinese Patent Applications No. 2020102944624, filed on Apr. 15, 2020, entitled "PRESSURE SENSING DISPLAY MODULE AND PANEL", and the entire content of which are incorporated herein by reference.

TECHNICAL FIELD

The present disclosure relates to pressure sensing devices, and in particular, to a pressure sensing display module and a panel having the same.

BACKGROUND

Electronic buttons of a vehicle electronic device are usually provided with force sensitive resistors to prevent accidental touches and actions. The force sensitive resistor is a special component that can convert mechanical force into electrical signal, which is made of semiconductor materials with pressure resistance effect. That is, a resistance value of the force sensitive resistor changes with magnitude of the applied force. The force sensitive resistor is mainly used in various pressure sensors, and may also be used in structural designs with the electronic buttons, such as product packaging or food packaging, device housings, wearable electronic devices, personal electronic devices, displays, detectors or sensors, vehicle interiors, antennas, tags, vehicle electronic devices, furniture, and the like. However, for a conventional pressure sensor provided with the force sensitive resistor inside, lines of the force sensitive resistor are full of a pressure sensing area of the pressure sensor, resulting in that the pressure sensor is unable to have both pressure sensing and display functions.

SUMMARY

According to various embodiments, a pressure sensing display module and a panel are provided.

A pressure sensing display module has a display area and a wiring area surrounding a periphery of the display area. The pressure sensing display module includes: a force sensitive unit provided in the wiring area; and a display unit provided corresponding to the display area. Information generated by the display unit is displayed on the display area.

A panel includes one or more buttons. The button includes the pressure sensing display module as described above. When the pressure sensing display module senses that the force sensitive unit is pressed, the button is selectively activated.

According to the above-mentioned pressure sensing display module and panel, the force sensitive unit is provided in the wiring area, the display unit is provided corresponding to the display area, and the display information generated by the display unit can be displayed on the display area, such that the force sensitive unit does not affect the display of the display unit. Therefore, the pressure sensing display module and the panel as described above can have both a pressure sensing function and a display function.

Details of one or more embodiments of the present application are set forth in the attached drawings and description. Other features, purposes and advantages of the present application will become apparent from the description, drawings, and claims.

BRIEF DESCRIPTION OF THE DRAWINGS

To illustrate the technical solutions according to the embodiments of the present disclosure or prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

In order to make the above objects, features and advantages of the present disclosure more obvious and understandable, the specific embodiments of the present disclosure will be illustrated in detail below in conjunctions with the accompanying drawings. In the following description, many specific details are set forth in order to assist readers in fully understanding of the present disclosure. However, the present disclosure can be implemented in many other ways than described herein, and those skilled in the art can make similar improvements without departing from the connotation of the present disclosure. Therefore, the present disclosure is not limited by the specific embodiments disclosed below.

In the description of the present disclosure, it should be understood that orientation or positional relationships indicated by terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. are based on orientation or positional relationship shown in the drawings, which are merely to facilitate the description of the present disclosure and simplify the description, not to indicate or imply that the device or elements must have a particular orientation, be constructed and operated in a particular orientation, and therefore cannot be construed as a limitation on the present disclosure.

In addition, the terms "first" and "second" are used for description only, and cannot be understood as indicating or implying relative importance or implicitly indicating the number of technical features described. Thus, the features defined with "first" and "second" may include at least one of the features explicitly or implicitly. In the description of the present disclosure, the meaning of "plurality" is at least two, such as two, three, etc., unless explicitly defined otherwise.

In the present disclosure, unless explicitly specified and limited otherwise, the terms "mounting", "connecting", "connected", "fixed" and the like should be understood in a broad sense. For example, it may be a fixed connection or a detachable connection, or an integration, may be a mechanical connection or electrical connection, may be a direct connection, or may be an indirect connection through an intermediate medium, may be the connection between two elements or the interaction relationships between two elements, unless explicitly defined otherwise. The specific meanings of the above terms in the present disclosure can be understood by one of those ordinary skills in the art according to specific circumstances.

In the present disclosure, unless explicitly specified and limited otherwise, the first feature being "on" or "below" the second feature may be that the first and second features are in a direct contact, or the first and second features are in an indirect contact through an intermediate medium. Moreover, the first feature being "over", "above" and "on" the second feature may be that the first feature is directly above or obliquely above the second feature, or simply means that the first feature is higher than the second feature in a horizontal direction. The first feature being "beneath", "under", and "below" the second feature may be that the first feature is directly below or obliquely below the second feature, or simply means that the first feature is lower than the second feature in a horizontal direction.

It should be noted that when an element is referred to as being "fixed" or "provided on" another element, it may be directly on another element or there may also be an intermediate element therebetween. When an element is considered to be "connected" to another element, it may be directly connected to another element or there may be an intermediate element therebetween. As used herein, the terms "vertical", "horizontal", "upper", "lower", "left", "right", and similar expressions are for illustration only and are not meant to be the only embodiments.

As previously mentioned, the wires of the force sensitive resistor of the conventional pressure sensor are full of the pressure sensing area of the pressure sensor, resulting in that the pressure sensor is unable to have both of the pressure sensing and display functions.

Figure 1:
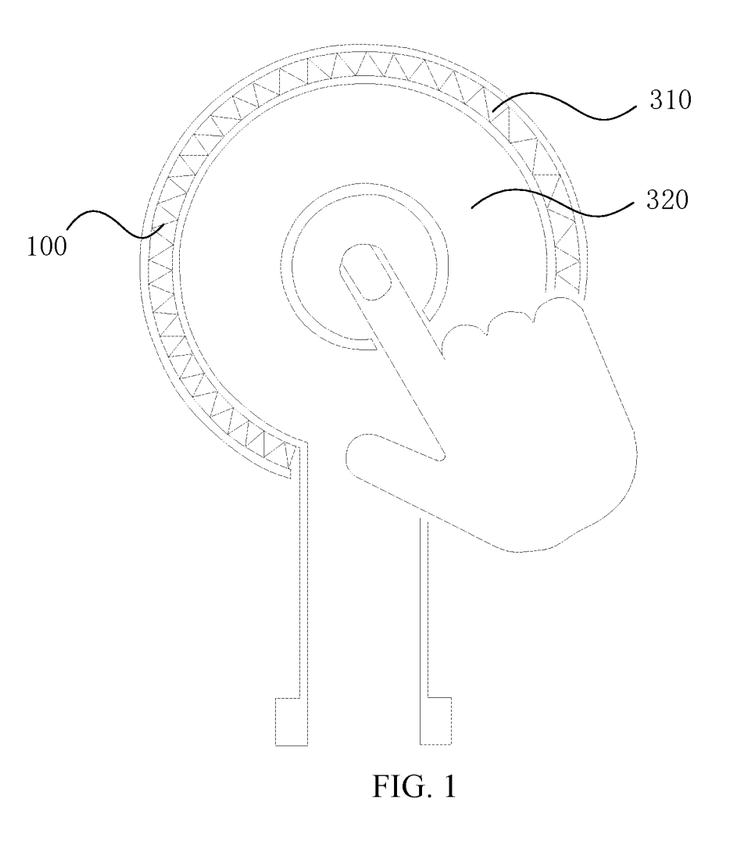
FIG. 1 is a front view of a pressure sensing display module according to an embodiment.

In order to address the above problem, a pressure sensing display module of an embodiment is provided. As shown in FIG. 1, the pressure sensing display module has a wiring area 310 and a display area 320 viewed from the front. The display area 320 is located in a middle portion of the pressure sensing display module and has a round shape, and the wiring area 310 surrounds a periphery of the display area 320.

Figure 2:
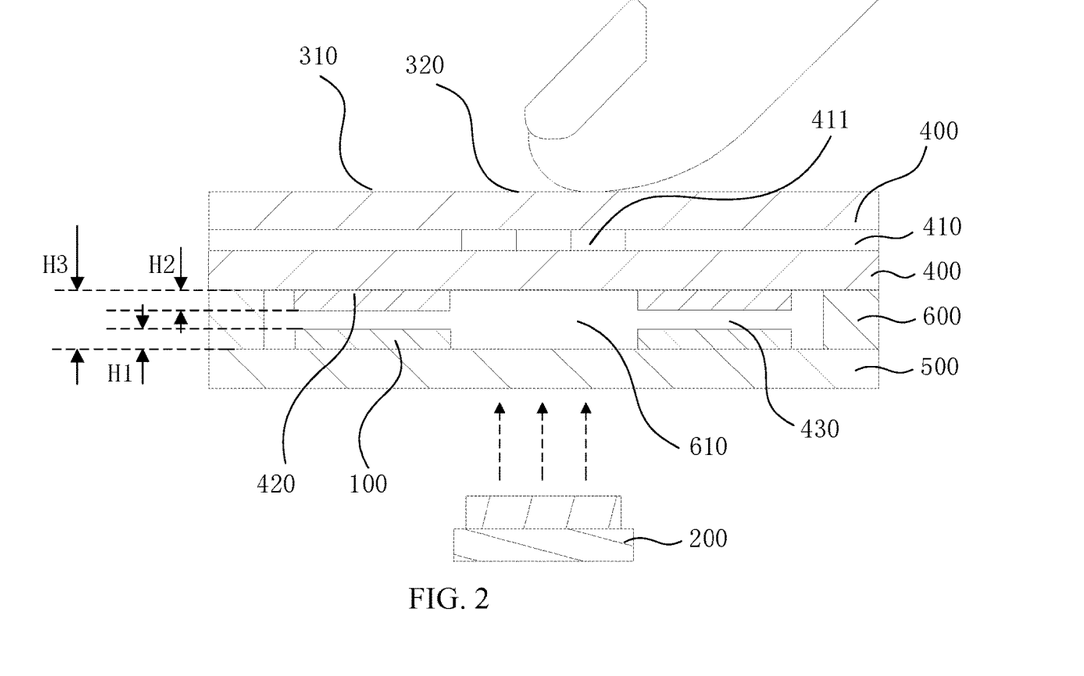
FIG. 2 is a cross-sectional view of the pressure sensing display module shown in FIG. 1.

Referring to FIG. 2, the pressure sensing display module includes a force sensitive unit 100 and a display unit 200. The force sensitive unit 100 is ring-shaped and arranged in the wiring area 310. The display unit 200 is provided corresponding to the display area 320. Information generated by the display unit 200 can be displayed on the display area 320, such that a user can observe the information generated by the display unit 200 through the display area 320. In the illustrated embodiment, the force sensitive unit 100 is a force sensitive resistor.

As shown in FIG. 2, the pressure sensing display module further includes a first substrate 400 and a second substrate 500. The force sensitive unit 100 is located between the first substrate 400 and the second substrate 500. Both of the first substrate 400 and the second substrate 500 are transparent substrates. A side of the first substrate 400 away from the second substrate 500 can serve as an operating surface, which can be operated and pressed by the user. The display unit 200 is located below the first substrate 400 and the second substrate 500. Light emitted by the display unit 200 can go through the second substrate 500 and the first substrate 400 sequentially, and is then observed by the user.

In an embodiment, the force sensitive unit 100 is electrically connected to the display unit 200. When the force sensitive unit 100 senses that it is pressed, the display unit 200 is activated to display information. The information generated by the display unit 200 is determined by the specific type of the display unit 200. In some embodiments, the display unit 200 is an LED lamp, a backlight module, a TFT or any other modules with display function.

Figure 3:
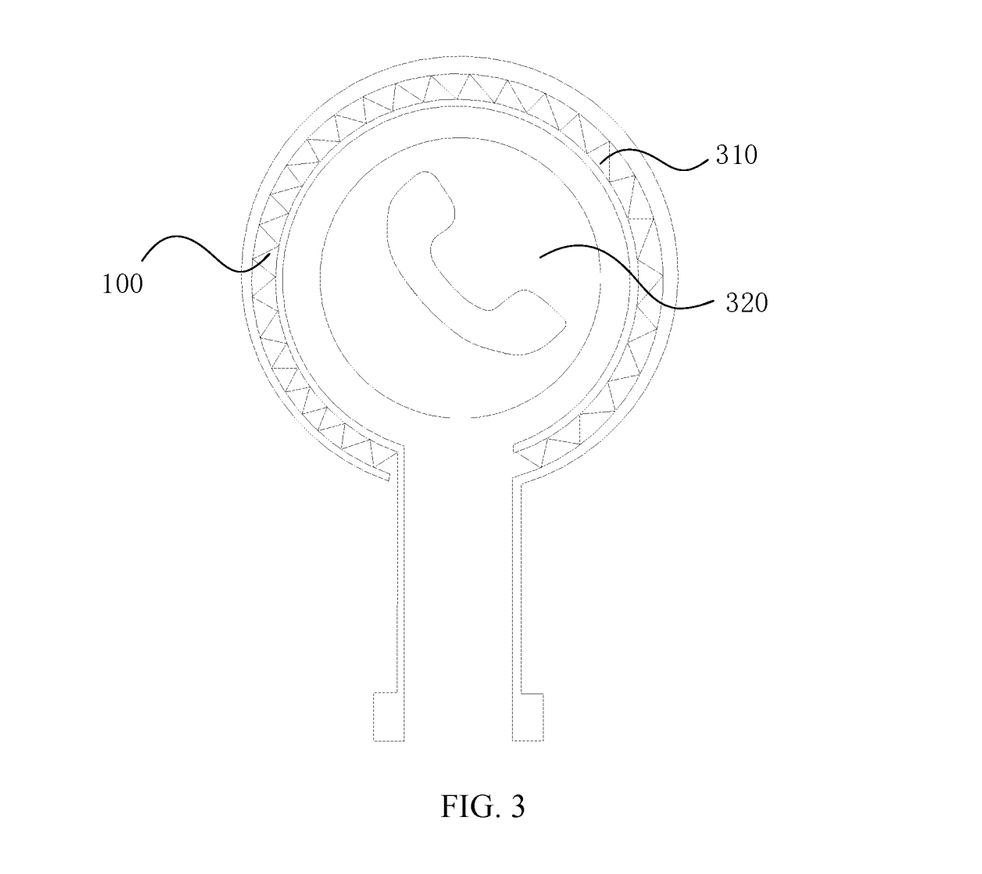
FIG. 3 is a front view of a pressure sensing display module according to another embodiment.

In addition, a decorative layer 410 is interposed inside the first substrate 400. A portion of the decorative layer 410 corresponding to the display unit 200 is provided with a decoration pattern 411. The decorative pattern 411 may be used to indicate a pressed position or function of the pressure sensing display module. For example, in an embodiment, as shown in FIG. 1, the decorative pattern 411 may be a circle for indicating the pressed position. As shown in FIG. 3, the decorative pattern 411 may be a phone logo. When the pressure sensing display module is pressed, the display unit 200 is activated and emits light. The light emitted by the display unit 200 goes through the second substrate 500 and the first substrate 400 sequentially to illuminate the phone logo, indicating that a button related to the phone logo has been activated, and a connection with another communication device has been established, thus prompting that the user can proceed with the next operation. In another embodiment, a picture or an animation can be displayed by the display unit 200 according to various programs. In another embodiment, when the pressure sensing display module is pressed for the first time or pressed again, a pressing signal can be transmitted to a main controller (not shown). The main controller will activate the display unit 200 or switch information displayed on the display unit 200 according to the pressing signal.

In an embodiment, as shown in FIG. 2, the pressure sensing display module further includes a spacer layer 600, which is hollow in a middle portion thereof. The spacer layer 600 is located between the first substrate 400 and the second substrate 500. A hollow area 610 of the spacer layer 600 corresponds to the display area 320 of the pressure sensing display module. The force sensitive unit 100 is located on a side of the second substrate 500 adjacent to the first substrate 400. A thickness H3 of the spacer layer 600 is greater than a thickness H1 of the force sensitive unit 100. The first substrate 400 is further provided with an ink shielding layer 420 on a side thereof adjacent to the second substrate 500. A shape, size, and position of the ink shielding layer 420 correspond to those of the force sensitive unit 100 and are used to shield the force sensitive unit 100. In an embodiment, the force sensitive unit 100 is adjacent to the display area 320. A width of the force sensitive unit 100 may be less than or equal to a width of the ink shielding layer 420, such that the ink shielding layer 420 can well shield the force sensitive unit 100.

In addition, as shown in FIG. 2, a sum (H1+H2) of the thickness H1 of the force sensitive unit 100 and a thickness H2 of the ink shielding layer 420 is less than the thickness H3 of the spacer layer 600. A gap 430 is formed between the force sensitive unit 100 and the ink shielding layer 420. Due to the existence of the gap 430, the pressure sensing display module have a pressure threshold. Only when the pressing force is greater than the pressure threshold, the first substrate 400 can be deformed to eliminate the gap 430 between the ink shielding layer 420 and the force sensitive unit 100, such that the pressing force is transmitted to the force sensitive unit 100, thereby effectively preventing the user from misoperation. In addition, the gap 430 further provides a space for the first substrate 400 to be bent and deformed downward when the pressing force is applied to the first substrate 400.

In an embodiment, in order to well transmit the pressing force acting on the first substrate 400 to the force sensitive unit 100, the first substrate 400 is made of a flexible material, such as Polyimide. In an embodiment, the second substrate 500 is made of a rigid material to protect the display unit 200 from being pressed, thereby ensuring the stability of the connection between the display unit 200 and other electronic components. Moreover, the types of the display unit 200 can be various, and any display unit 200 with display function can be used in the above-mentioned pressure sensing display module.

Figure 4:
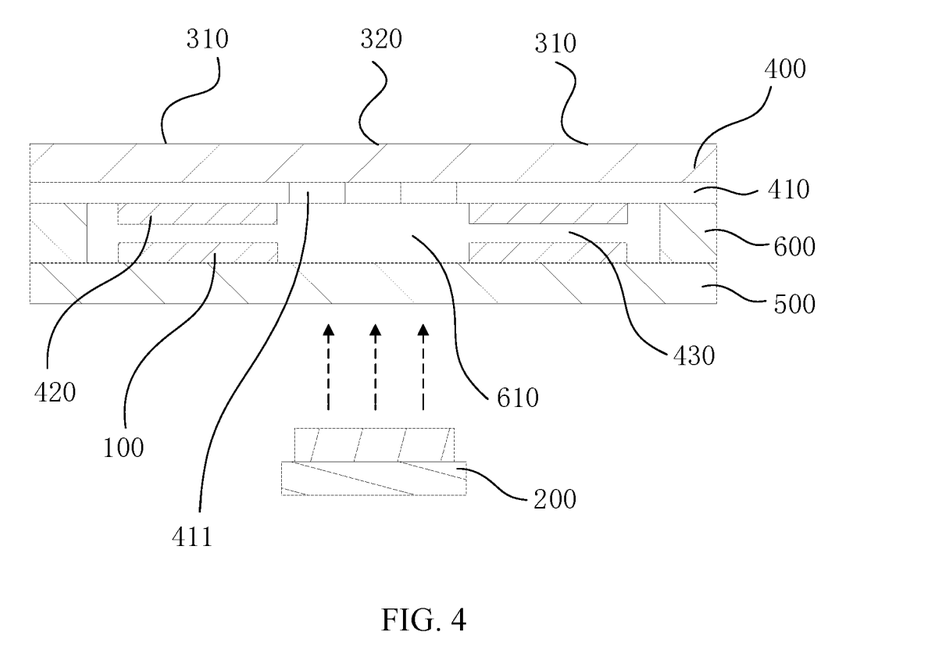
FIG. 4 is a cross-sectional view of a pressure sensing display module according to another embodiment.

In another embodiment, as shown in FIG. 4, the decorative layer 410 is located on a surface of the first substrate 400 adjacent to the second substrate 500. The ink shielding layer 420 is located on a side of the decorative layer 410 away from the first substrate 400.

Figure 5:
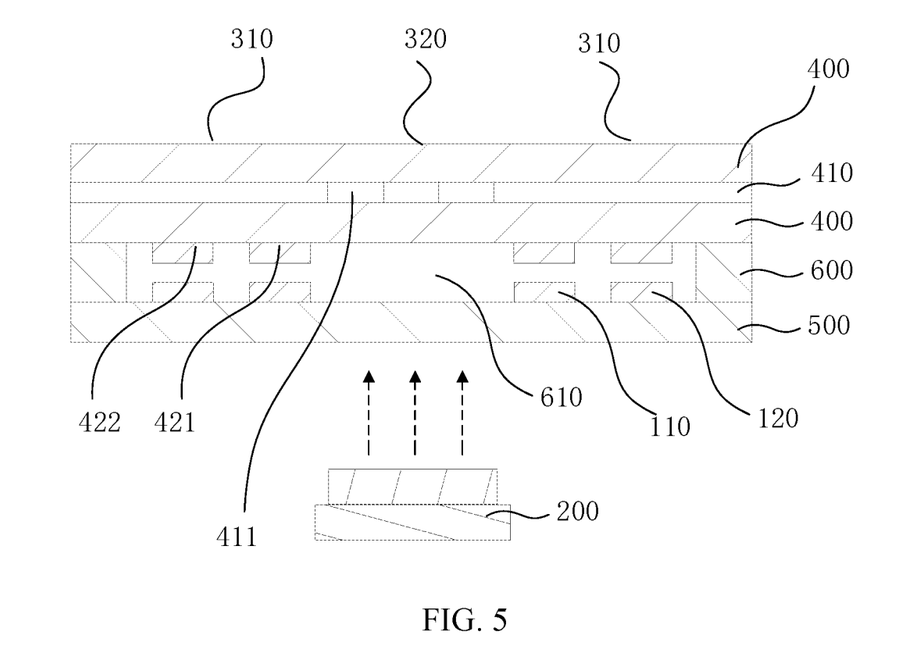
FIG. 5 is a cross-sectional view of a pressure sensing display module according to another embodiment.
Figure 6:
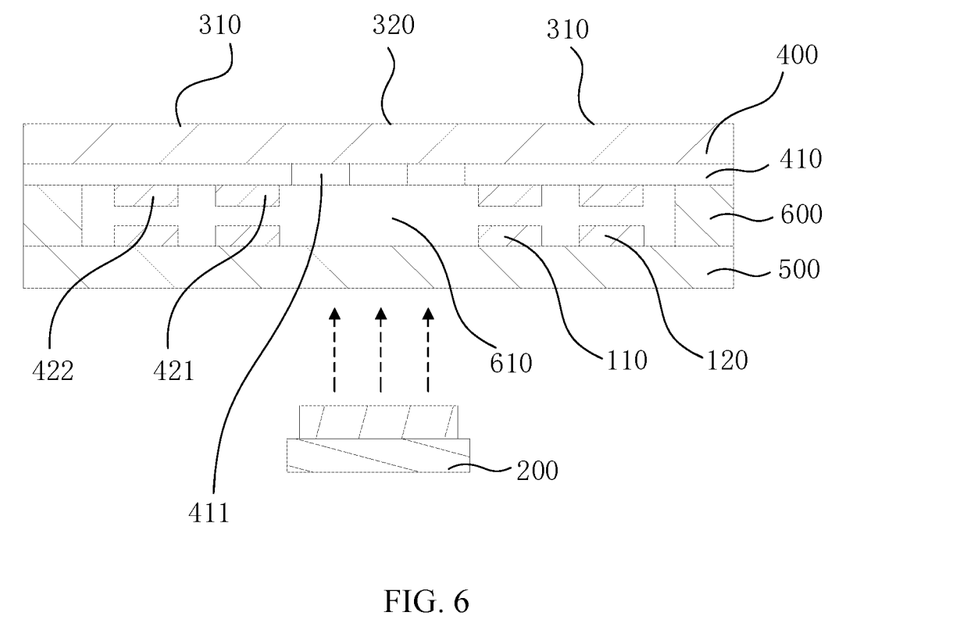
FIG. 6 is a cross-sectional view of a pressure sensing display module according to another embodiment.
Figure 7:
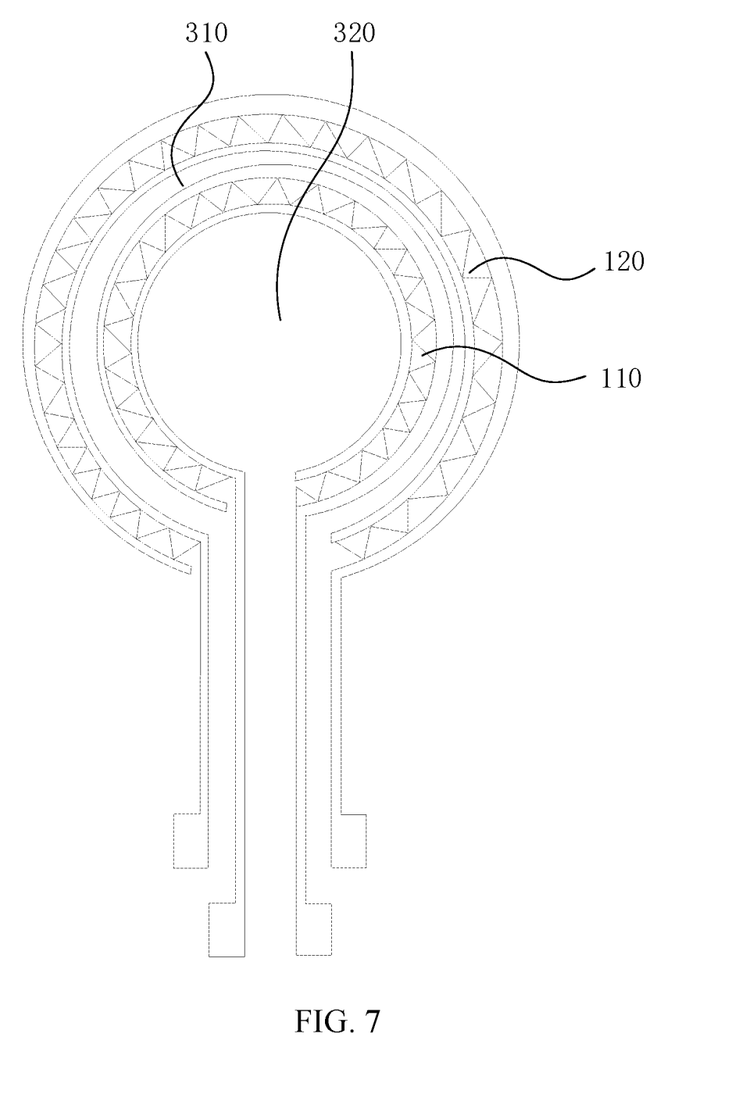
FIG. 7 is a front view of a pressure sensing display module according to another embodiment.

In another embodiment, as shown in FIGS. 5 to 7, the force sensitive unit 100 includes a first resistor 110 and a second resistor 120. The first resistor 110 is substantially ring-shaped and surrounds the display area 320. The second resistor 120 is substantially ring-shaped and arranged on an outer side of the first resistor 110 away from the display area 320. The ink shielding layer 420 includes a first ink layer 421 and a second ink layer 422. A shape, size, and position of the first ink layer 421 correspond to those of the first resistor 110, and the first ink layer 421 is used to shield the first resistor 110. A shape, size, and position of the second ink layer 422 correspond to those of the second resistor 120, and the second ink layer 422 is used to shield the second resistor 120. In the embodiment shown in FIG. 5, the decorative layer 410 is sandwiched in the first substrate 400. The first ink layer 421 and the second ink layer 422 are both provided on a side of the first substrate 400 adjacent to the second substrate 500. In the embodiment shown in FIG. 6, the decorative layer 410 is provided on a surface of the first substrate 400 adjacent to the second substrate 500. The first ink layer 421 and the second ink layer 422 are both provided on a side of the decorative layer 410 adjacent to the second substrate 500.

It should be noted that the number of force sensitive units 100 is not limited. In other embodiments, two or more force sensitive units 100 may be provided. In addition, the shape of the force sensitive unit 100 is not limited. In the embodiments shown in FIGS. 1 and 6, the force sensitive unit 100 is in the shape of a circular ring. It is understood that in other embodiments, the force sensitive unit 100 can also be other ring structures such as square ring and elliptical ring.

Figure 10:
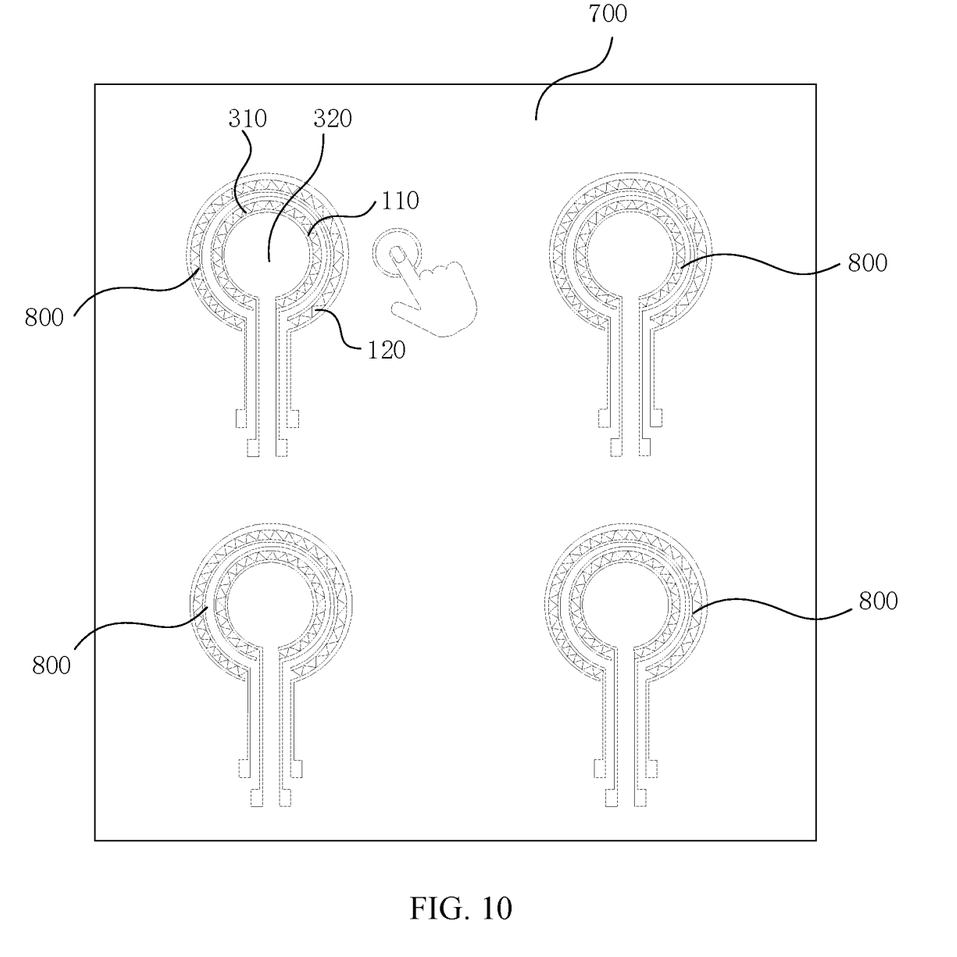
FIG. 10 is a front view of a panel according to an embodiment.

As shown in FIG. 10, in an embodiment, a panel 700 is provided, which includes one or more buttons 800. The button 800 includes the pressure sensing display module as described above. When the pressure sensing display module senses that the force sensitive unit 100 is pressed, the button 800 is selectively activated.

Figure 8:
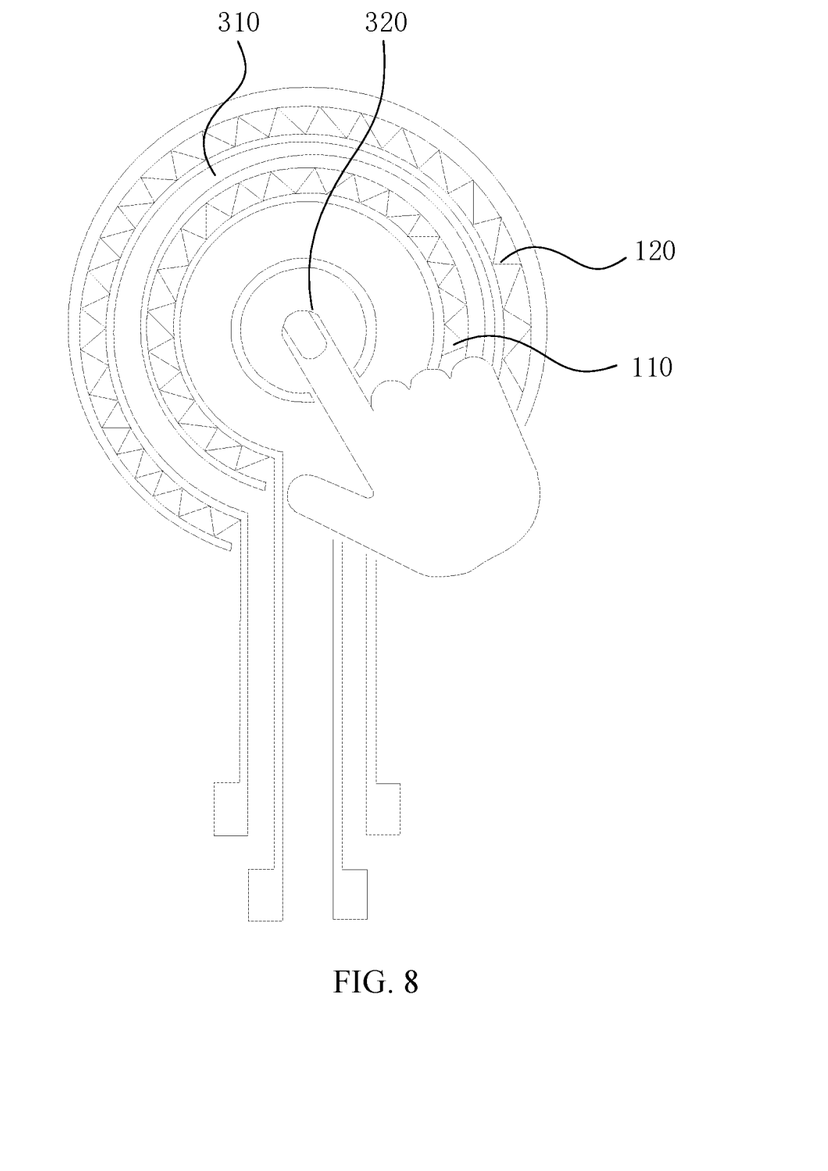
FIG. 8 is a front view of the pressure sensing display module shown in FIG. 7, when being pressed normally.
Figure 9:
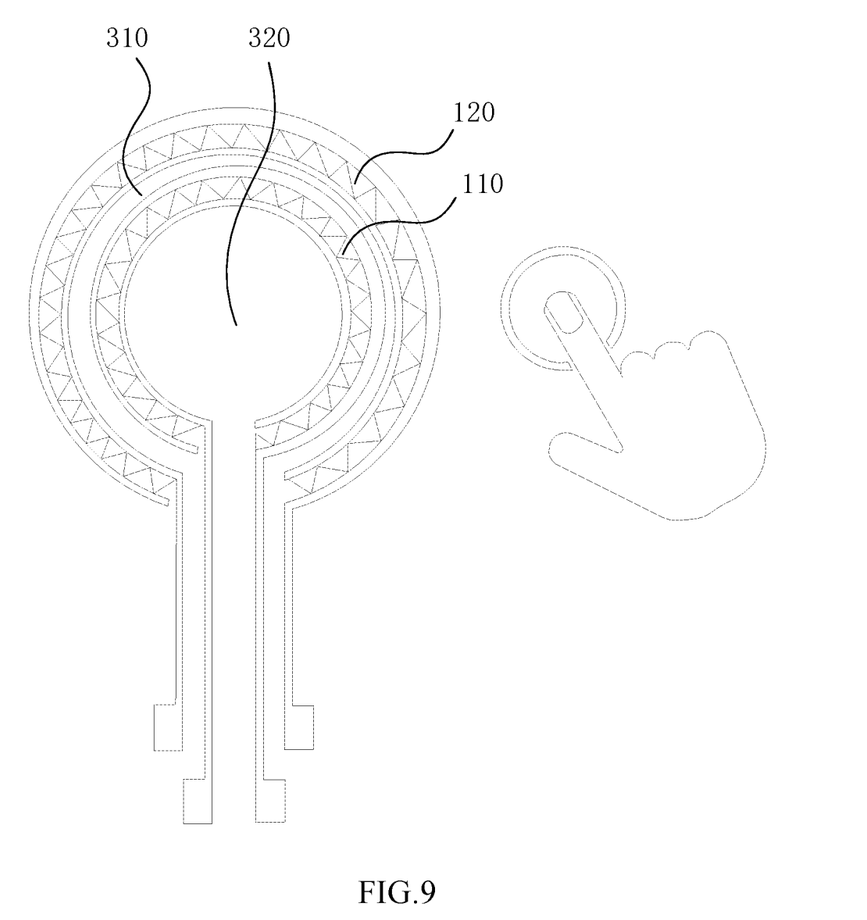
FIG. 9 is a front view of the pressure sensing display module shown in FIG. 7, when being pressed abnormally.

In an embodiment, as shown in FIG. 7, when the pressure sensing display module is not pressed, the resistance change rate $\Delta R1/R1$ of the first resistor 110 and the resistance change rate $\Delta R2/R2$ of the second resistor 120 are both equal to zero, where R1 is a resistance of the first resistor when the pressure sensing display module is not pressed, $\Delta R1$ is a change in the resistance of the first resistor after the pressure sensing display module is pressed, R2 is a resistance of the second resistor when the pressure sensing display module is not pressed, and $\Delta R2$ is a change in the resistance of the second resistor after the pressure sensing display module is pressed. As shown in FIG. 8, when the pressure sensing display module is normally pressed, that is, when the display area 320 is pressed, since the first resistor 110 is closer to the pressed area (i.e., the display area 320) than the second resistor 120, the pressing force applied to the first resistor 110 is greater than the pressing force applied to the second resistor 120. In this case, the resistance change rate $\Delta R1/R1$ of the first resistor 110 will be greater than the resistance change rate $\Delta R2/R2$ of the second resistor 120. In addition, in order to prevent the user from misoperation, a critical threshold value K is predetermined. Only when the resistance change rate $\Delta R1/R1$ of the first resistor 110 is greater than the resistance change rate $\Delta R2/R2$ of the second resistor 120, and when the resistance change rate $\Delta R1/R1$ of the first resistor 110 is greater than the critical threshold value K, the button 800 will be activated.

As shown in FIG. 10, four buttons 800 are provided on the panel 700. Each button 800 includes a pressure sensing display module. Each pressure sensing display module is provided with the first resistor 110 and the second resistor 120. The wiring area 310 and the display area 320 of each pressure sensing display module are located in a non-edge area of the panel 700. When the pressure sensing display module is pressed abnormally, that is, areas other than the wiring area 310 and the display area 320 is pressed, the pressing force applied to the first resistor 110 is less than the pressing force applied to the second resistor 120, and the resistance change rate $\Delta R1/R1$ of the first resistor 110 is less than the resistance change rate $\Delta R2/R2$ of the second resistor 120. In this case, the buttons 800 are turned off or deactivated. It should be understood that in other embodiments, two or more force sensitive units 100 may be provided. By providing two or more force sensitive units 100 in the wiring area 310 of the pressure sensing display module, the pressure sensing display module and the panel can determine a position where it is being pressed independently, and misoperations can be more effectively prevented. The misoperation mentioned herein refers to not only slight pressing with a small pressing force, but also abnormal pressing outside the wiring area 310 and the display area 320.

Figure 11:
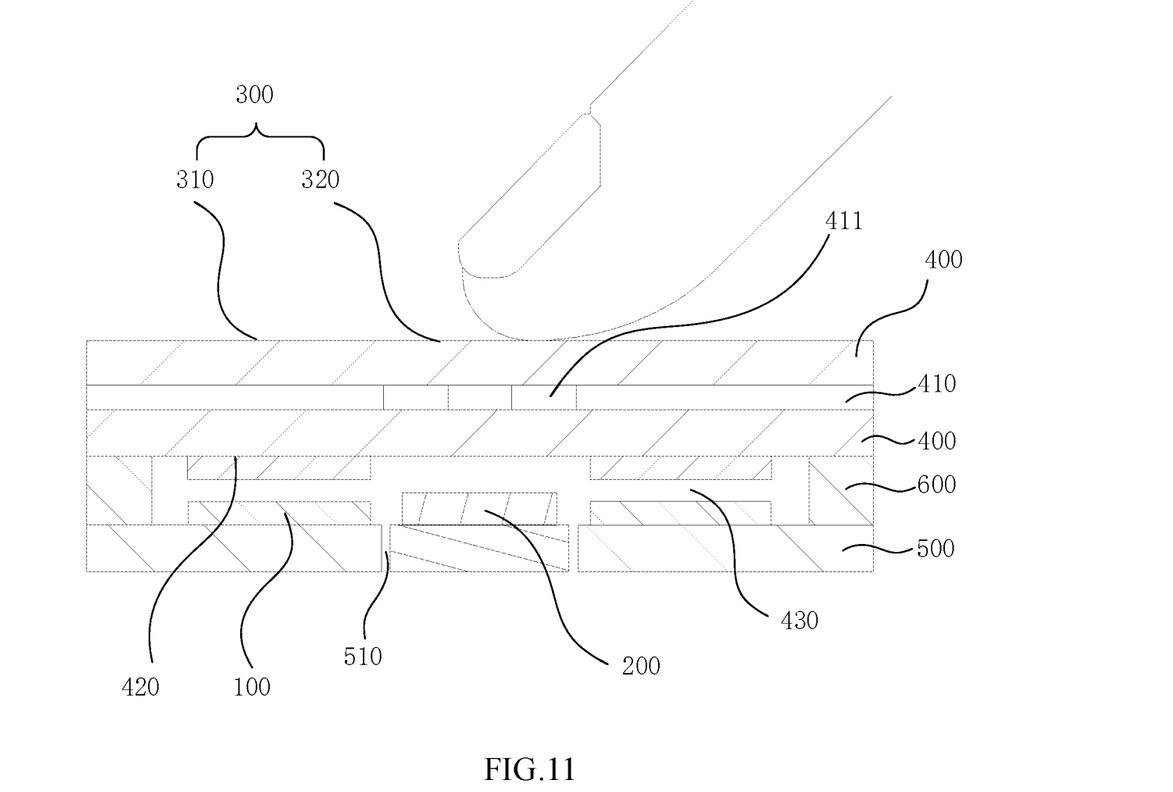
FIG. 11 is a cross-sectional view of a pressure sensing display module according to another embodiment.
Figure 12:
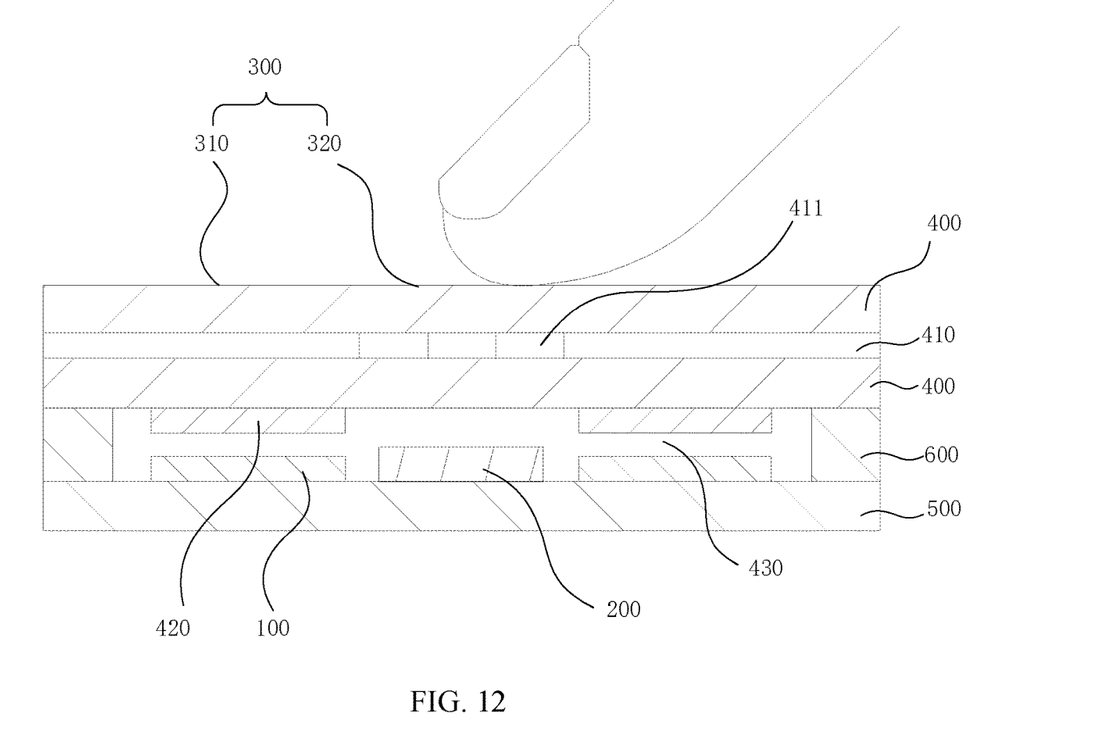
FIG. 12 is a cross-sectional view of a pressure sensing display module according to another embodiment.

In addition, in the embodiments shown in FIGS. 2 and 4 to 6, the display unit 200 is located below the first substrate 400 and the second substrate 500. The information generated by the display unit 200 can be displayed on the display area 320 in such a way that the light emitted by the display unit 200 goes through the second substrate 500 and the first substrate 400 sequentially. It should be understood that in other embodiments, the display unit 200 may also be provided at other positions. For example, in an embodiment, as shown in FIG. 11, a mounting hole 510 may be provided on the second substrate 500. The display unit 200 is embedded in the mounting hole 510, such that the light emitted by the display unit 200 can go through the first substrate 400. In another embodiment, as shown in FIG. 12, the display unit 200 can also be directly located on a surface of the second substrate 500 adjacent to the first substrate 400. That is, the display unit 200 and the force sensitive unit 100 are provided on the same layer. The light emitted by the display unit 200 can go through the first substrate 400. In the embodiments shown in FIGS. 11 and 12, the display unit 200 is embedded in the second substrate 500 or directly located on the surface of the second substrate 500 adjacent to the first substrate 400, such that the overall thickness of the pressure sensitive display module can be reduced.

According to the above-mentioned pressure sensing display module and panel, by reasonably deploying the structure of the pressure sensing display module, the force sensitive unit 100 is designed to include the wiring area 310 and the display area 320, and the wiring area 310 is located on the periphery of the display area, the force sensitive unit 100 is distributed in the wiring area 310, the display unit 200 is provided corresponding to the display area 320, and the display information generated by the display unit 200 can be displayed on the display area 320, such that the force sensitive unit 100 does not affect the display of the display unit 200. Therefore, the pressure sensing display module and the panel of the aforementioned embodiments can have both pressure sensing function and display function.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A pressure sensing display module, having a display area and a wiring area surrounding a periphery of the display area, the pressure sensing display module comprising:
   a force sensitive unit provided in the wiring area;
   a display unit provided corresponding to the display area, wherein information generated by the display unit is displayed on the display area;
   a first substrate and a second substrate, wherein the force sensitive unit is located between the first substrate and the second substrate, light emitted by the display unit penetrates through the second substrate and the first substrate sequentially; and
   a spacer located between the first substrate and the second substrate and being in contact with a side of the first substrate adjacent to the second substrate, wherein the spacer defines a hollow area corresponding to the display area;
   the force sensitive unit is located on a side of the second substrate adjacent to the first substrate and is spaced apart from the first substrate, and a thickness of the spacer is greater than a thickness of the force sensitive unit.

2. The pressure sensing display module according to claim 1, wherein the display unit is located below the first substrate and the second substrate.

3. The pressure sensing display module according to claim 1, wherein the display unit is located inside the second substrate, or, the display unit is located on a side of the second substrate adjacent to the first substrate.

4. The pressure sensing display module according to claim 1, wherein the first substrate is a flexible substrate, such that pressure is transmitted from the first substrate to the force sensitive unit.

5. The pressure sensing display module according to claim 1, further comprising a decorative layer provided on a side of the first substrate adjacent to the second substrate, wherein a portion of the decorative layer corresponding to the display unit is provided with a decoration pattern.

6. The pressure sensing display module according to claim 1, further comprising a decorative layer provided inside the first substrate, wherein a portion of the decorative layer corresponding to the display unit is provided with a decoration pattern.

7. The pressure sensing display module according to claim 1, wherein the first substrate is provided with an ink shielding layer on a side thereof adjacent to the second substrate, the ink shielding layer corresponds to the force sensitive unit and is configured to shield the force sensitive unit.

8. The pressure sensing display module according to claim 7, wherein a sum of the thickness of the force sensitive unit and a thickness of the ink shielding layer is less than the thickness of the spacer, and a gap is formed between the force sensitive unit and the ink shielding layer.

9. The pressure sensing display module according to claim 1, wherein a plurality of force sensitive units are ring-shaped and distributed in the wiring area at intervals.

10. The pressure sensing display module according to claim 1, wherein the force sensitive unit comprises a first resistor surrounding the display area and a second resistor that is ring-shaped and arranged on an outer side of the first resistor away from the display area.

11. The pressure sensing display module according to claim 10, wherein the first substrate is provided with an ink shielding layer on a side thereof adjacent to the second substrate, the ink shielding layer comprises a first ink layer corresponding to the first resistor and a second ink layer corresponding to the second resistor.

12. The pressure sensing display module according to claim 1, further comprising the second substrate being spaced from the force sensitive unit such that the second substrate does not contact the force sensitive unit in the absence of force applied to the first substrate.

13. A panel, comprising a button, the button comprising a pressure sensing display module, the pressure sensing display module having a display area and a wiring area surrounding a periphery of the display area, the pressure sensing display module comprising:
   a force sensitive unit provided in the wiring area;
   a display unit provided corresponding to the display area, wherein information generated by the display unit is displayed on the display area, and when the pressure sensing display module senses that the force sensitive unit is pressed, the button is selectively activated;
   a first substrate and a second substrate, wherein the force sensitive unit is located between the first substrate and the second substrate, light emitted by the display unit penetrates through the second substrate and the first substrate sequentially; and a spacer located between the first substrate and the second substrate and being in contact with a side of the first substrate adjacent to the second substrate, wherein the spacer defines a hollow area corresponding to the display area, the force sensitive unit is located on a side of the second substrate adjacent to the first substrate and is spaced apart from the first substrate, and a thickness of the spacer is greater than a thickness of the force sensitive unit.

14. The panel according to claim 13, wherein the wiring area and the display area are located in a non-edge area of the panel.

15. The panel according to claim 13, wherein the force sensitive unit comprises a first resistor surrounding the display area and a second resistor that is ring-shaped and arranged on an outer side of the first resistor away from the display area.

16. The panel according to claim 15, wherein when a resistance change rate of the first resistor is greater than a resistance change rate of the second resistor, and when the resistance change rate of the first resistor is greater than a critical threshold value, the button is activated.

17. The panel according to claim 15, wherein when a resistance change rate of the first resistor is less than a resistance change rate of the second resistor, the button is turned off or deactivated.

18. The panel according to claim 13, further comprising the second substrate being spaced from the force sensitive unit such that the second substrate does not contact the force sensitive unit in the absence of force applied to the first substrate.

* * * * *